United States Patent
Kim et al.

(10) Patent No.: US 9,005,482 B2
(45) Date of Patent: Apr. 14, 2015

(54) PASTE COMPOSITION FOR REAR ELECTRODE OF SOLAR CELL AND SOLAR CELL INCLUDING THE SAME

(75) Inventors: Sang Gon Kim, Seoul (KR); In Jae Lee, Seoul (KR); Soon Gil Kim, Seoul (KR); Jin Gyeong Park, Seoul (KR); Sun Mi Lee, Seoul (KR); Kyoung Hoon Chai, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 637 days.

(21) Appl. No.: 13/334,983

(22) Filed: Dec. 22, 2011

(65) Prior Publication Data

US 2012/0161082 A1 Jun. 28, 2012

(30) Foreign Application Priority Data

Dec. 24, 2010 (KR) ........................ 10-2010-0134531

(51) Int. Cl.
*H01B 1/22* (2006.01)
(52) U.S. Cl.
CPC ...................................... *H01B 1/22* (2013.01)

(58) Field of Classification Search
USPC .................... 252/500, 512; 427/192; 136/256
See application file for complete search history.

(56) References Cited

U.S. PATENT DOCUMENTS

| | | |
|---|---|---|
| 2006/0022173 A1 | 2/2006 | Yamakawa et al. |
| 2007/0164260 A1 | 7/2007 | Kuwajima |
| 2007/0246245 A1 | 10/2007 | Ahn et al. |

FOREIGN PATENT DOCUMENTS

WO WO-2010/117207 A2 10/2010

OTHER PUBLICATIONS

European Search Report dated Apr. 23, 2012 in European Application No. 11194990.5.

*Primary Examiner* — Mark Kopec
*Assistant Examiner* — Haidung Nguyen
(74) *Attorney, Agent, or Firm* — Saliwanchik, Lloyd & Eisenschenk

(57) ABSTRACT

A paste composition for a rear electrode of a solar cell according to an embodiment comprises conductive powder including a first powder having a first mean particle diameter, a second powder having a second mean particle diameter larger than the first mean particle diameter, and a third powder having a third mean particle diameter larger than the second mean particle diameter, and an organic vehicle.

17 Claims, 1 Drawing Sheet

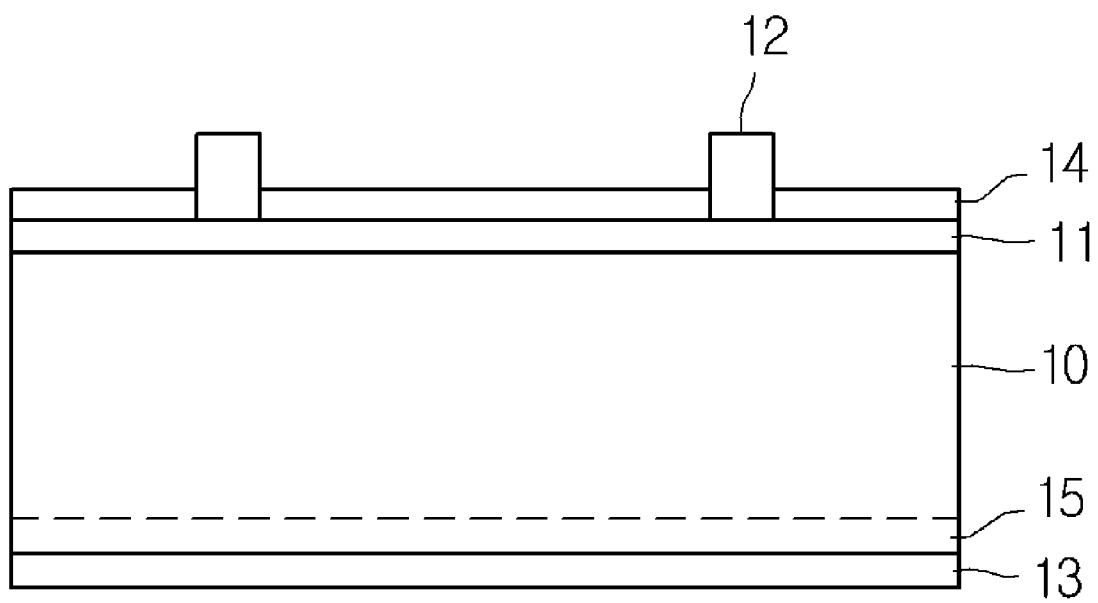

PASTE COMPOSITION FOR REAR ELECTRODE OF SOLAR CELL AND SOLAR CELL INCLUDING THE SAME

CROSS-REFERENCE TO RELATED APPLICATION

This application claims the benefit under 35 U.S.C. §119 of Korean Patent Application No. 10-2010-0134531, filed Dec. 24, 2010, which is hereby incorporated by reference in its entirety.

BACKGROUND

The present disclosure relates to a paste composition for a rear electrode of a solar cell and a solar cell including a rear electrode prepared by using the paste composition.

Importance in the developments of next generation clean energies has been increased due to the depletion of fossil fuels in recent years. Among the clean energies, solar cells are expected as an energy source that can resolve future energy problems because of less pollution, unlimited resources, and semi-permanent lifespan.

Such solar cells may include front and rear electrodes formed on a silicon substrate. Paste compositions including conductive powders are printed and then these electrodes may be formed by sintering. However, when the compositions of the paste compositions are not optimized, bumps may be formed on the electrodes during the formation of the electrodes and thus, efficiency of the solar cell may decrease because contact characteristics with respect to the silicon substrate deteriorate.

BRIEF SUMMARY

Embodiments provide a paste composition for a rear electrode of a solar cell capable of improving efficiency and a solar cell including a rear electrode formed by using the paste composition.

In one embodiment, a paste composition for a rear electrode of a solar cell comprises: a conductive powder including a first powder having a first mean particle diameter, a second powder having a second mean particle diameter larger than the first mean particle diameter, and a third powder having a third mean particle diameter larger than the second mean particle diameter; and an organic vehicle.

The first mean particle diameter may be in a range of about 1.5 µm to about 2.5 µm, the second mean particle diameter may be in a range of about 4.5 µm to about 5.5 µm, and the third mean particle diameter may be in a range of about 9.5 µm to about 10.5 µm.

About 20.1 to 21.1 parts by weight of the first powder, about 29.7 to 37 parts by weight of the second powder, and about 12.8 to 20.1 parts by weight of the third powder may be included based on 100 parts by weight of the paste composition. Also, about 12.8 to 13.8 parts by weight of the first powder, about 37 to 43.3 parts by weight of the second powder, and about 12.8 to 20.1 parts by weight of the third powder may be included based on 100 parts by weight of the paste composition.

The conductive powder may include aluminum.

The first to the third powders may be spherical powders or non-spherical powders, respectively.

The first powder may be a spherical powder, the second powder may be a non-spherical powder, and the third powder may be a spherical powder.

The organic vehicle may be included in an amount range of about 20 to 30 parts by weight based on 100 parts by weight of the paste composition.

The paste composition may further comprise a glass frit, wherein the glass frit may be included in an amount range of about 3 to 5 parts by weight based on 100 parts by weight of the paste composition.

In another embodiment, a solar cell comprises a rear electrode formed by using the foregoing paste composition for a rear electrode of a solar cell.

The details of one or more embodiments are set forth in the accompanying drawings and the description below. Other features will be apparent from the description and drawings, and from the claims.

BRIEF DESCRIPTION OF THE DRAWINGS

FIG. 1 is a cross-sectional view illustrating a solar cell according to an embodiment.

DETAILED DESCRIPTION

In the description of embodiments, it will be understood that when a layer (or film), region, pattern or structure is referred to as being "on" and "under" another layer (or film), region, pad or pattern, the terminology of "on" and "under" includes both the meanings of "directly" and "indirectly".

Since the thickness or size of each layer (or film), region, pattern or structure in the drawings may be modified for convenience in description and clarity, the size of each element does not entirely reflect an actual size.

Hereinafter, a paste composition for a rear electrode (hereinafter, referred to as a "paste composition") used for the formation of a solar cell and a rear electrode of the solar cell according to the present invention will be described in detail.

An example of a solar cell to which a paste composition of the present invention is applicable will be described with reference to FIG. 1. FIG. 1 is a cross-sectional view illustrating a solar cell according to an embodiment.

Referring to FIG. 1, a solar cell includes a P-type silicon substrate 10 including an n-type semiconductor part 11 on a front surface thereof, a front electrode 12 electrically connected to the n-type semiconductor part 11, and a rear electrode 13 electrically connected to the P-type silicon substrate 10. An anti-reflective layer 14 may be formed on an upper surface of the n-type semiconductor part 11 except the front electrode 12. A back surface field (BSF) 15 may be formed on the silicon substrate 10 on which the rear electrode 13 is formed.

The paste composition of the present invention may be used for forming the foregoing rear electrode 13 of the solar cell. That is, the silicon substrate 10 is coated with the paste composition of the present invention and then the rear electrode 13 may be formed by drying and sintering. For example, the paste composition may be dried at a temperature range of 80° C. to 200° C. for one minute to 30 minutes and may be sintered by a rapid heat treatment at a temperature range of 700° C. to 900° C.

The paste composition may include conductive powder, organic vehicle, glass frit, and additive.

In the embodiment, the conductive powder includes spherical powder and non-spherical powder. Powder having a plate shape, a rod shape, or a flake shape may be used as the non-spherical powder.

Aluminum powder constituting a major component of the rear electrode 13 may be used as the conductive powder.

In the embodiment, the conductive powder includes a first powder having a first mean particle diameter, a second powder having a second mean particle diameter larger than the first mean particle diameter, and a third powder having a third mean particle diameter larger than the second mean particle diameter. That is, since the conductive powder includes the first to the third powders having different mean particle diameters from one another, a packing ratio of the conductive powder may increase and electrical properties of the rear electrode 13 thus prepared may improve.

For example, the first mean particle diameter may be in a range of 1.5 μm to 2.5 μm, the second mean particle diameter may be in a range of 4.5 μm to 5.5 μm, and the third mean particle diameter may be in a range of 9.5 μm to 10.5 μm. This is for maximizing the effect of improving the packing ratio while having different mean particle diameters from one another. Herein, a mean particle diameter with respect to the spherical powder may be obtained based on a particle diameter thereof, and with respect to the non-spherical powder, a mean particle diameter may be obtained based on the length of a long side.

That is, the mean particle diameter of the conductive powder is a minimum of 1.5 μm and a maximum of 10.5 μm. The reason for this is below. When the mean particle diameter is less than 1.5 μm, dispersion may not be facilitated because spaces between the conductive powders, in which an organic vehicle or the like may be introduced, are less. When the mean particle diameter is greater than 10.5 μm, density may decrease and resistance may increase because many voids between the conductive powders exist. However, the present invention is not limited thereto, and three powders having different mean particle diameters form one another may be used.

Herein, the packing ratio may be further improved by using the first powder as a spherical powder, the second powder as a non-spherical powder, and the third powder as a spherical powder. However, this may be changed according to the mean particle diameters of the first to the third powders, and the embodiment is not limited thereto.

The foregoing conductive powder may be included in an amount range of 62.6 to 78.2 parts by weight based on 100 parts by weight of the paste composition. When the conductive powder is included in an amount greater than 78.2 parts by weight, the composition may not be formed as a paste. When the conductive powder is included in an amount less than 62.6 parts by weight, electrical conductivity of the prepared rear electrode 13 may be low because the amount of the conductive powder decreases.

At this time, based on 100 parts by weight of the paste composition, 20.1 to 21.1 parts by weight of the first powder, 29.7 to 37 parts by weight of the second powder, and 12.8 to 20.1 parts by weight of the third powder may be included. Also, based on 100 parts by weight of the paste composition, 12.8 to 13.8 parts by weight of the first powder, 37 to 43.3 parts by weight of the second powder, and 12.8 to 20.1 parts by weight of the third powder may be included. The foregoing ranges are limited to ranges in which bumps are not formed when the rear electrodes 13 are formed by using the paste compositions.

The organic vehicle may be formed by dissolving a binder in a solvent and may further include an antifoaming agent, a dispersant, etc. An organic solvent such as terpineol or carbitol may be used as the solvent, and an acryl-based resin, a cellulose-based resin, or an alkyd resin may be used as the binder. However, the present invention is not limited thereto, and various organic vehicles may be used.

At this time, the organic vehicle may be included in an amount range of 20 to 30 parts by weight based on 100 parts by weight of the paste composition. When the organic vehicle is included in an amount greater than 30 parts by weight, electrical conductivity of the prepared rear electrode 13 may be lowered because the amount of the conductive powder is small and printability may deteriorate because viscosity is low. When the organic vehicle is included in an amount less than 20 parts by weight, bonding characteristics with respect to the silicon substrate 10 may degrade and printability may deteriorate because viscosity increases.

A $PbO$—$SiO_2$ system, a $PbO$—$SiO_2$—$B_2O_3$ system, a $ZnO$—$SiO_2$ system, a $ZnO$—$B_2O_{3-SiO2}$ system, or a $Bi_2O_3$—$B_2O_3$—$ZnO$—$SiO_2$ system may be used as the glass frit.

At this time, the glass frit may be included in an amount range of 3 to 5 parts by weight based on 100 parts by weight of the paste composition. The glass frit within a range of 3 to 5 parts by weight may improve adhesion, sinterability, and post-processing characteristics of the solar cell.

A dispersant, a thixotropic agent, a leveling agent, and an antifoaming agent may further be included as the additive. Polymer/organic materials, such as urea-based, amide-based, and urethane-based materials, or an inorganic material such as silica may be used as the thixotropic agent.

The additive may be included in an amount range of 0.1 to 10 parts by weight based on 100 parts by weight of the paste composition. In the foregoing range, electrical conductivity may be maintained at a high level because a sufficient amount of the conductive powder is added, and effects caused by the additive may be obtained.

The foregoing paste composition may be prepared by the following method.

A binder is dissolved in a solvent, and an organic vehicle is then formed by pre-mixing. Aging is performed for 1 hour to 12 hours by adding conductive powder and additive into the organic vehicle. At this time, a glass frit may be added together. The aged mixture is mechanically mixed and dispersed through a 3-roll mill. The mixture is filtered and degassed to prepare a paste composition. However, the foregoing method is merely provided as an example and the present invention is not limited thereto.

With respect to a solar cell including the rear electrode 13 formed by using the paste composition according to the embodiment, the efficiency thereof may improve because an open-circuit voltage increases. When bumps are formed on the rear electrode, the bumps may be regarded as appearance defects. However, in the embodiment, failure rate may be decreased by removing the bumps on the rear electrode.

Hereinafter, the present invention will be described in more detail according to particular examples. However, the following examples are merely presented to exemplify the present invention, and the present invention is not limited thereto.

EXAMPLE 1

An organic vehicle was prepared by dissolving a binder in a solvent. A mixed solvent of diethylene glycol monobutyl ether acetate and α-terpineol was used as the solvent, and ethyl cellulose was used as the binder.

Conductive powder, glass frit, and additive were added into the organic vehicle and then mixed. The mixture was aged for 12 hours and secondary mixing and dispersion were then performed by using a 3-roll mill. The mixture was filtered and degassed to prepare a paste composition.

Aluminum powder was used as the conductive powder and a first powder, a second powder, and a third powder having a respective mean particle diameter of 2 μm, 5 μm, and 10 μm were mixed.

20.1 parts by weight of the first powder, 37.0 parts by weight of the second powder, 12.8 parts by weight of the third powder, 21.9 parts by weight of the organic vehicle, 3.4 parts by weight of the glass frit, and 4.8 parts by weight of the additive were included based on 100 parts by weight of the paste composition.

A 200 μm thick silicon substrate was coated with the foregoing paste composition by using a screen printing method, and then dried at 200° C. for 2 minutes. A rear electrode was prepared by performing a rapid heat treatment at 900° C. for 30 seconds.

EXAMPLE 2

A rear electrode was prepared in the same manner as Example 1 except that 20.1 parts by weight of the first powder, 29.7 parts by weight of the second powder, and 20.1 parts by weight of the third powder were included based on 100 parts by weight of the paste composition.

EXAMPLE 3

A rear electrode was prepared in the same manner as Example 1 except that 12.8 parts by weight of the first powder, 37.0 parts by weight of the second powder, and 20.1 parts by weight of the third powder were included based on 100 parts by weight of the paste composition.

EXAMPLE 4

A rear electrode was prepared in the same manner as Example 1 except that 13.8 parts by weight of the first powder, 43.3 parts by weight of the second powder, and 12.8 parts by weight of the third powder were included based on 100 parts by weight of the paste composition.

EXAMPLE 5

A rear electrode was prepared in the same manner as Example 1 except that 12.8 parts by weight of the first powder, 43.3 parts by weight of the second powder, and 13.8 parts by weight of the third powder were included based on 100 parts by weight of the paste composition.

COMPARATIVE EXAMPLE

A rear electrode was prepared in the same manner as Example 1 except that 15.9 parts by weight of the first powder, 38.1 parts by weight of the second powder, and 15.9 parts by weight of the third powder were included based on 100 parts by weight of the paste composition.

Short-circuit currents (Isc), open-circuit voltages (Voc), fill factors (FF), efficiencies (EFF), and presence of bumps formed on the rear electrodes of solar cells including the rear electrodes according to Examples 1 to 5 and Comparative Example were measured, and the results thereof are presented in Table 1.

TABLE 1

| | Short-circuit current [A] | Open-circuit voltage [V] | Fill factor | Efficiency [%] | Presence of bumps |
|---|---|---|---|---|---|
| Example 1 | 8.53263 | 0.61933 | 0.748 | 16.54 | Absence |
| Example 2 | 8.50903 | 0.61733 | 0.75467 | 16.59 | Absence |
| Example 3 | 8.4968 | 0.61767 | 0.75767 | 16.6433 | Absence |
| Example 4 | 8.48585 | 0.619 | 0.7595 | 16.7 | Absence |
| Example 5 | 8.45217 | 0.61967 | 0.74967 | 16.4233 | Absence |
| Comparative Example | 8.40777 | 0.60967 | 0.746 | 16.01 | Presence |

It may be understood that bumps were not formed on the rear electrodes of the solar cells in Examples 1 to 5, but bumps are formed on the rear electrode of the solar cell in Comparative Example.

That is, in Examples 1 to 5, it may be understood that the bumps on the rear electrodes may be removed by optimizing a ratio of the conductive powders having different mean particle diameters from one another in the paste compositions.

Referring to Table 1, it may be understood that Examples 1 to 5 showed excellent open-circuit voltage values and efficiencies in comparison to those of Comparative Example. Therefore, it may be understood that a solar cell including a rear electrode prepared by using the paste composition according to the present invention may have excellent open-circuit voltage and efficiency characteristics.

According to an embodiment, bumps on a rear electrode may be removed by including first to third powders having different mean particle diameters from one another at an appropriate composition ratio. Open-circuit voltage characteristics and efficiency of a solar cell including the rear electrode thus prepared may be improved. When bumps are formed on the rear electrode, the bumps may be regarded as appearance defects. However, in the embodiment, failure rate may be decreased by removing the bumps on the rear electrode.

Features, structures, or effects described in the foregoing embodiment are included in at least one embodiment of the present invention, and are not necessarily limited to only one embodiment thereof. Further, the features, structures, or effects exemplified in each embodiment may be combined or modified by those skilled in the art and implemented to other embodiments thereof. Therefore, descriptions related to such combinations and modifications will be construed as being included in the scope of the present invention.

Also, while this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A paste composition for a rear electrode of a solar cell comprising:

a conductive powder including a first powder having a first mean particle diameter, a second powder having a second mean particle diameter larger than the first mean particle diameter, and a third powder having a third mean particle diameter larger than the second mean particle diameter; and an organic vehicle;
wherein about 20.1 to 21.1 parts by weight of the first powder, about 29.7 to 37 parts by weight of the second powder, and about 12.8 to 20.1 parts by weight of the third powder are included based on 100 parts by weight of the paste composition.

2. The paste composition for a rear electrode of a solar cell according to claim 1, wherein the first mean particle diameter is in a range of about 1.5 μm to about 2.5 μm, the second mean particle diameter is in a range of about 4.5 μm to about 5.5 μm, and the third mean particle diameter is in a range of about 9.5 μm to about 10.5 μm.

3. A paste composition for a rear electrode of a solar cell comprising:
a conductive powder including a first powder having a first mean particle diameter, a second powder having a second mean particle diameter larger than the first mean particle diameter, and a third power having a third mean particle diameter larger than the second me particle diameter; and
an organic vehicle.
wherein about 12.8 to 13.8 parts by weight of the first powder, about 37 to 43.3 parts by weight of the second powder, and about 12.8 to 20.1 parts by weight of the third powder are included based on 100 parts by weight of the paste composition.

4. The paste composition for a rear electrode of a solar cell according to claim 1, wherein the conductive powder includes aluminum.

5. The paste composition for a rear electrode of a solar cell according to claim 1, wherein the first powder, the second powder, and the third powder are spherical powders or non-spherical powders, respectively.

6. The paste composition for a rear electrode of a solar cell according to claim 5, wherein the first powder is a spherical powder, the second powder is a non-spherical powder, and the third powder is a spherical powder.

7. The paste composition for a rear electrode of a solar cell according to claim 1, wherein the organic vehicle is included in an amount range of about 20 to 30 parts by weight based on 100 parts by weight of the paste composition.

8. The paste composition for a rear electrode of a solar cell according to claim 1, wherein the organic vehicle includes a solvent and a binder, the solvent includes terpineol or carbitol, and the binder includes an acryl-based resin, a cellulose-based resin, or an alkyd resin.

9. The paste composition for a rear electrode of a solar cell according to claim 1, wherein the paste composition further comprises a glass frit,
wherein the glass fit is included in an amount range of about 3 to 5 parts by weight based on 100 parts by weight of the paste composition.

10. The paste composition for a rear electrode of a solar cell according to claim 9, wherein the glass frit includes a PbO—SiO$_2$ system, a PbO—SiO$_2$—B$_2$O$_3$ system, a ZnO—SiO$_2$ system, a ZnO—B$_2$O$_3$—SiO$_2$ system, or a Bi$_2$O$_3$—B$_2$O$_3$—ZnO—SiO$_2$ system.

11. The paste composition for a rear electrode of a solar cell according to claim 1, wherein the paste composition further comprises an additive,
wherein the additive is included in an amount range of about 0.1 to 10 parts by weight based on 100 parts by weight of the paste composition.

12. The paste composition for a rear electrode of a solar cell according to claim 11, wherein the additive includes a dispersant, a thixotropic agent, a leveling agent, or an antifoaming agent.

13. The paste composition for a rear electrode of a solar cell according to claim 1, wherein the paste composition further comprises a glass frit and an additive,
wherein the glass frit is included in an amount range of about 3 to 5 parts by weight based on 100 parts by weight of the paste composition, and the additive is included in an amount range of about 0.1 to 10 parts by weight based on 100 parts by weight of the paste composition.

14. The paste composition for a rear electrode of a solar cell according to claim 13, wherein the organic vehicle includes a solvent and a binder, the solvent includes terpineol or carbitol, the binder includes an acryl-based resin, a cellulose-based resin, or an alkyd resin, and the additive includes a dispersant, a thixotropic agent, a leveling agent, or an antifoaming agent.

15. The paste composition for a rear electrode of a solar cell according to claim 3, wherein the paste composition further comprises a glass frit and an additive,
wherein the glass frit is included in an amount range of about 3 to 5 parts by weight based on 100 parts by weight of the paste composition, and the additive is included in an amount range of about 0.1 to 10 parts by weight based on 100 parts by weight of the paste composition.

16. The paste composition for a rear electrode of a solar cell according to claim 15, wherein the organic vehicle includes a solvent and a binder, the solvent includes terpineol or carbitol, the binder includes an acryl-based resin, a cellulose-based resin, or an alkyd resin, and the additive includes a dispersant, a thixotropic agent, a leveling agent, or an antifoaming agent.

17. A solar cell comprising a rear electrode formed by using the paste composition for a rear electrode of a solar cell according to claim 1.

* * * * *